United States Patent
Suzuki

(10) Patent No.: US 11,764,066 B2
(45) Date of Patent: Sep. 19, 2023

(54) PEELING METHOD FOR PEELING OFF SUBSTRATE FROM SUPPORT PLATE

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 374 days.

(21) Appl. No.: 17/180,295

(22) Filed: Feb. 19, 2021

(65) Prior Publication Data
US 2021/0175085 A1    Jun. 10, 2021

Related U.S. Application Data

(62) Division of application No. 16/281,872, filed on Feb. 21, 2019, now Pat. No. 10,998,196.

(30) Foreign Application Priority Data

Feb. 27, 2018  (JP) ................................. 2018-033502

(51) Int. Cl.
*H01L 21/304* (2006.01)
*H01L 21/78* (2006.01)
(Continued)

(52) U.S. Cl.
CPC ........ *H01L 21/3043* (2013.01); *H01L 21/568* (2013.01); *H01L 21/6835* (2013.01); *H01L 21/78* (2013.01); *H01L 21/561* (2013.01)

(58) Field of Classification Search
CPC ... H01L 21/3043; H01L 21/568; H01L 21/78; H01L 21/6385; H01L 21/561;
(Continued)

(56) References Cited

U.S. PATENT DOCUMENTS 5,863,375 A    1/1999  Cha et al.
6,077,383 A    6/2000  Laporte
(Continued)

FOREIGN PATENT DOCUMENTS

JP    2015145306 A    8/2015
JP    2016201519 A    12/2016
WO    2017026279 A1    2/2017

OTHER PUBLICATIONS

DE App. 10 2019 202 564.1: Office Action (translation) dated May 25, 2021 (7 pages).

*Primary Examiner* — Andres Munoz
(74) *Attorney, Agent, or Firm* — Greer, Burns & Crain, Ltd.

(57) ABSTRACT

A peeling method for peeling off a substrate provided over a front surface of a support plate through a peel layer from the support plate after dividing the substrate into a plurality of small pieces, the peeling method comprising: a first holding step of holding the support plate by a first holding unit; a dividing step of causing a cutting blade to cut into the substrate, or applying a laser beam of such a wavelength as to be absorbed in the substrate to the substrate, along division lines set on the substrate, to divide the substrate into the plurality of small pieces; a start point region forming step of blowing a fluid to the peel layer exposed at an end portion of a small piece among the plurality of small pieces, to form a start point region which will serve as a start point when peeling off the small piece from the support plate; a second holding step of holding the small piece by a second holding unit; and a peeling step of relatively moving the first holding unit and the second holding unit in directions for spacing away from each other, to peel off the small piece from the support plate.

17 Claims, 6 Drawing Sheets

(51) Int. Cl.
*H01L 21/683* (2006.01)
*H01L 21/56* (2006.01)

(58) Field of Classification Search
CPC ... H01L 2221/68331; H01L 2221/6834; H01L 2221/68381; H01L 2221/68386
See application file for complete search history.

(56) References Cited

U.S. PATENT DOCUMENTS

| | | |
|---|---|---|
| 6,342,433 B1 | 1/2002 | Ohmi et al. |
| 6,375,738 B1 | 4/2002 | Sato |
| 6,376,332 B1 | 4/2002 | Yanagita et al. |
| 6,391,743 B1 | 5/2002 | Iwane et al. |
| 6,900,114 B2 | 5/2005 | Ohmi et al. |
| 6,972,215 B2 | 12/2005 | Sakaguchi et al. |
| 7,029,950 B2 | 4/2006 | Yonehara et al. |
| 7,060,590 B2 | 6/2006 | Bressot et al. |
| 8,912,048 B2 * | 12/2014 | Kim .................. H01L 21/82 438/118 |
| 9,337,098 B1 | 5/2016 | Seddon et al. |
| 9,595,463 B2 | 3/2017 | Priewasser |
| 2002/0174958 A1 | 11/2002 | Yanagita et al. |
| 2003/0032210 A1 | 2/2003 | Takayama et al. |
| 2009/0075458 A1 * | 3/2009 | Nakamura ........... B28D 5/0029 438/464 |
| 2011/0318881 A1 | 12/2011 | Chida et al. |
| 2015/0328872 A1 | 11/2015 | Koyanagi et al. |
| 2016/0079119 A1 | 3/2016 | Tomono |

* cited by examiner

PEELING METHOD FOR PEELING OFF SUBSTRATE FROM SUPPORT PLATE

This application is a divisional of application Ser. No. 16/281,872, filed Feb. 21, 2019, incorporated by reference in its entirety.

BACKGROUND OF THE INVENTION

Field of the Invention

The present invention relates to a peeling method for peeling off a substrate or the like provided over a front surface of a support plate through a peel layer from the support plate.

Description of the Related Art

In an electronic apparatus such as a mobile phone and a personal computer, a device chip provided with a device such as an electronic circuit is an indispensable component. The device chip is obtained, for example, by a method in which a front surface of a wafer formed from a semiconductor material such as silicon is partitioned into a plurality of regions by division lines (streets), then a device is formed in each of the regions, and thereafter the wafer is divided along the division lines.

The device chip obtained by the aforementioned method is fixed, for example, to a mother substrate for chip size package (CSP), is electrically connected by such a method as wire bonding, and is thereafter sealed with a molding resin. With the device chip thus sealed with the molding resin to form a package device, the device chip can be protected from external factors such as shocks, light, heat, and water.

In recent years, a packaging technology called fan-out wafer level packaging (FOWLP) in which package terminals are formed outside the region of a device chip by use of a re-wiring technique on a wafer level has come to be adopted (see, for example, Japanese Patent Laid-open No. 2016-201519). In addition, a packaging technology called fan-out panel level packaging (FOPLP) in which package devices are manufactured collectively on the level of a panel (typically, a glass substrate used for manufacture of a liquid crystal panel) larger than the size of a wafer has also been proposed.

In the FOPLP, for example, a wiring layer (RDL: redistribution layer) is formed over a front surface of a support plate (carrier plate) serving as a temporary substrate through a peel layer (temporary adhesion layer), and a device chip is joined to the wiring layer. Next, the device chip is sealed with a molding resin, to obtain a sealed substrate (package panel). Thereafter, the sealed substrate is thinned by such a method as grinding, after which the sealed substrate is divided, to complete package devices.

SUMMARY OF THE INVENTION

In the aforementioned FOPLP, for example, after the sealed substrate is divided into package devices, the support plate is removed from the package devices. Specifically, each package device is picked up from the support plate. However, since the adhesive force of the peel layer is strong to a certain extent, it has been difficult to peel off the package device from the support plate without damaging the wiring layer or the like in the package device.

On the other hand, it may be contemplated to peel off and remove the support plate from the sealed substrate before dividing the sealed substrate into package devices. However, in this case, also, it has been difficult to peel off the sealed substrate from the support plate without damaging the support plate or the sealed substrate including the wiring layer and the like.

It is therefore an object of the present invention to provide a peeling method by which a substrate or the like can be easily peeled off from a support plate.

In accordance with an aspect of the present invention, there is provided a peeling method for peeling off a substrate provided over a front surface of a support plate through a peel layer from the support plate, the peeling method including: a first holding step of holding one of the support plate and the substrate by a first holding unit; a start point region forming step of blowing a fluid to an end portion of the peel layer exposed at an end portion of the support plate and the substrate, to form a start point region which will serve as a start point when peeling off the substrate from the support plate; a second holding step of holding the other of the support plate and the substrate by a second holding unit; and a peeling step of relatively moving the first holding unit and the second holding unit in directions for spacing away from each other, to peel off the substrate from the support plate.

In the described aspect of the present invention, a side of the front surface of the end portion of the support plate may be covered with part of a metallic film or resin film constituting the peel layer, and the peeling method may further include a removing step of removing the metallic film or resin film covering the side of the front surface of the end portion of the support plate by a cutting blade or a laser beam, before the start point region forming step.

In accordance with another aspect of the present invention, there is provided a peeling method for peeling off a substrate provided over a front surface of a support plate through a peel layer from the support plate after dividing the substrate into a plurality of small pieces, the peeling method including: a first holding step of holding the support plate by a first holding unit; a dividing step of causing a cutting blade to cut into the substrate, or applying a laser beam of such a wavelength as to be absorbed in the substrate to the substrate, along division lines set on the substrate, to divide the substrate into the plurality of small pieces; a start point region forming step of blowing a fluid to the peel layer exposed at an end portion of a small piece among the plurality of small pieces, to form a start point region which will serve as a start point when peeling off the small piece from the support plate; a second holding step of holding the small piece by a second holding unit; and a peeling step of relatively moving the first holding unit and the second holding unit in directions for spacing away from each other, to peel off the small piece from the support plate.

In the peeling methods according to the aspect and another aspect of the present invention, a fluid is blown to an end portion of the peel layer, to form the start point region which will serve as a start point when peeling off the substrate, or each of small pieces obtained by dividing the substrate, from the support plate. Therefore, the substrate or the small piece can be easily peeled off from the support plate, with the start point region as a start point.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment according to an aspect of the present invention will be described referring to the attached drawings. A peeling method according to the present embodiment is a peeling method for peeling off a substrate (sealed substrate) provided over a front surface of a support plate (carrier plate) through a peel layer (temporary adhesion layer) from the support plate, and includes a first holding step (see FIG. 1B), a start point region forming step (see FIG. 2A), a second holding step (see FIG. 2B), and a peeling step (see FIG. 3).

In the first holding step, one of the support plate and the substrate (in the present embodiment, the substrate) is held by a chuck table (first holding unit), and the other (in the present embodiment, the support plate) is exposed. In the start point region forming step, a fluid is blown to an end portion of the peel layer, to form a start point region which will serve as a start point when peeling off the substrate from the support plate.

In the second holding step, the other of the support plate and the substrate (the support plate) is held by a suction pad (second holding unit). In the peeling step, the first holding unit and the second holding unit are relatively moved in directions for spacing away from each other, to peel the substrate from the support plate. The peeling method according to the present embodiment will be described in detail below.

Figure 1A:
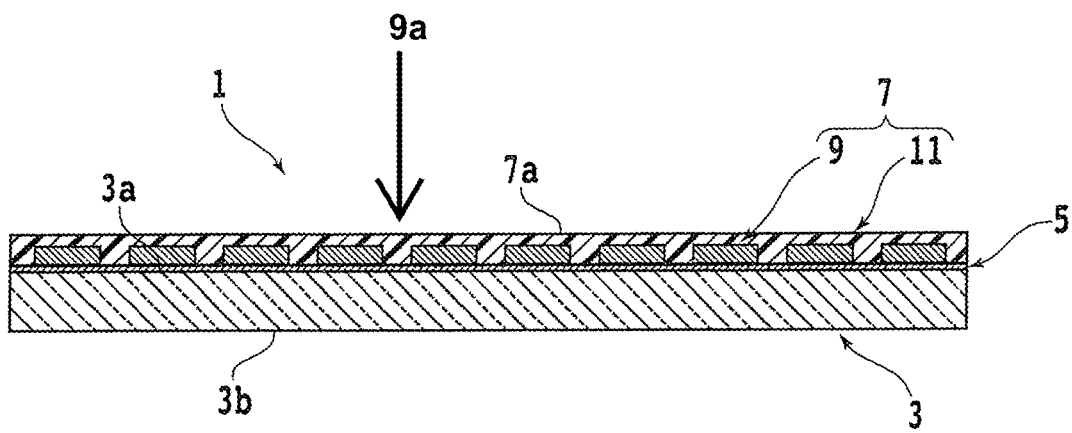
FIG. 1A is a sectional view illustrating a configuration example of a composite substrate including a support plate and a substrate.

FIG. 1A is a sectional view illustrating a configuration example of a composite substrate 1 used in the present embodiment. The composite substrate 1 includes a support plate (carrier plate) 3 formed from an insulating material such as, for example, soda glass, borosilicate glass, or quartz glass. The support plate 3 includes, for example, a roughly flat first surface (front surface) 3a, and a second surface (back surface) 3b on the side opposite to the first surface 3a, and is rectangular in shape in plan view from the first surface 3a side or the second surface 3b side. The thickness of the support plate 3 is, for example, not more than 2 mm, and is typically 1.1 mm.

Note that while the support plate 3 formed from the insulating material such as soda glass, borosilicate glass or quartz glass is used in the present embodiment, the material, shape, structure, size, and the like of the support plate 3 are not particularly limited. For example, a substrate or the like formed from a material such as, for example, a semiconductor, a ceramic, a resin or a metal may also be used as the support plate 3. A disk-shaped semiconductor wafer or the like may also be used as the support plate 3.

A substrate (sealed substrate) 7 is provided on the first surface 3a side of the support plate 3 through a peel layer (temporary adhesion layer) 5. The peel layer 5 is provided on substantially the whole part of the first surface 3a by stacking a metallic film, an insulating material film or the like, for example, and has a function of adhering the support plate 3 and the substrate 7 to each other. In addition, the peel layer 5 may include a resin film or the like which functions as an adhesive.

The thickness of the peel layer 5 is, for example, not more than 20 μm, and is typically 5 μm. When the substrate 7 is peeled off from the support plate 3 in the peeling step described later, the peel layer 5 is separated into a first portion 5a (see FIG. 3 and the like) in close contact with the support plate 3 side, and a second portion 5b (see FIG. 3 and the like) in close contact with the substrate 7 side.

The substrate 7 is called, for example, a package panel, a package wafer or the like, and includes a wiring layer (RDL) (not illustrated) in contact with the peel layer 5, a plurality of device chips 9 joined to the wiring layer, and a sealing material (molding resin layer) 11 for sealing each of the device chips. The substrate 7 is configured in substantially the same size and shape as the support plate 3 in plan view. The thickness of the substrate 7 is, for example, not more than 1.5 mm, and is typically 0.6 mm.

Note that the first surface (front surface) 7a side of the substrate 7 may be processed by such a method as grinding. In addition, in those regions of the substrate 7 which are between the adjacent chips 9, division lines (cutting lines) (streets) 9a (see FIG. 1A) are set. By cutting the substrate 7 along arbitrary division lines, the substrate 7 is divided into a plurality of small pieces each including one or a plurality of device chips 9.

When the substrate 7 (or the small chips) is cut along all the division lines, a plurality of package devices corresponding to the device chips 9 are obtained. It is to be noted, however, that the material, shape, structure, size, and the like of the substrate 7 are not particularly limited. For instance, the substrate 7 may include mainly the wiring layer, and may not include the device chips 9, the sealing material 11 or the like.

Figure 1B:
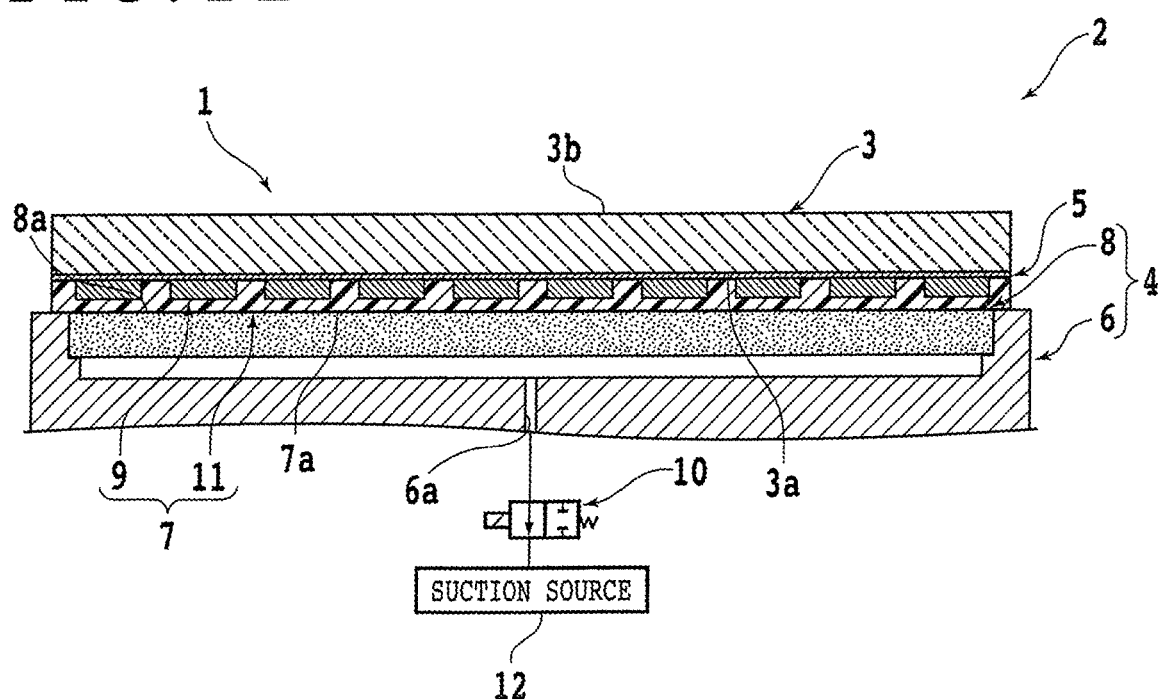
FIG. 1B is a sectional view illustrating a first holding step.

In the pealing method according to the present embodiment, first, a first holding step of holding the substrate 7 side of the aforementioned composite substrate 1 and exposing the support plate 3 side is performed. FIG. 1B is a sectional view illustrating the first holding step. Note that in FIG. 1B, part of the components is depicted in terms of functional blocks.

The first holding step is carried out using a peeling apparatus 2 depicted in FIG. 1B and the like. The peeling apparatus 2 has a chuck table (first holding unit) 4 for holding the composite substrate 1. The chuck table 4 includes a cylindrical frame body 6 formed from a metallic material represented by stainless steel, for example, and a holding plate 8 that is formed from a porous material and is disposed on the upper side of the frame body 6.

An upper surface of the holding plate 8 is a holding surface 8a for suction holding the substrate 7 side of the composite substrate 1. A lower surface side of the holding plate 8 is connected to a suction source 12 through a passage 6a provided inside the frame body 6, a valve 10, and the like. Therefore, with the valve 10 opened, a negative pressure of the suction source 12 can be made to act at the holding surface 8a.

The chuck table 4 (frame body 6) is connected to a rotational drive source (not illustrated) such as a motor, and is rotated around a rotational axis which is substantially parallel to the aforementioned holding surface 8a. In addition, the chuck table 4 (frame body 6) is supported by a moving mechanism (not illustrated), and is moved in a direction substantially parallel to the aforementioned holding surface 8a.

In the first holding step, as depicted in FIG. 1B, for example, the first surface 7a of the substrate 7 is put into contact with the holding surface 8a of the chuck table 4. Then, the valve 10 is opened, to cause the negative pressure of the suction source 12 to act at the holding surface 8a. By this, the substrate 7 side of the composite substrate 1 is suction held by the chuck table 4. Thus, the second surface 3b side of the support plate 3 is in an exposed state.

Figure 2A:
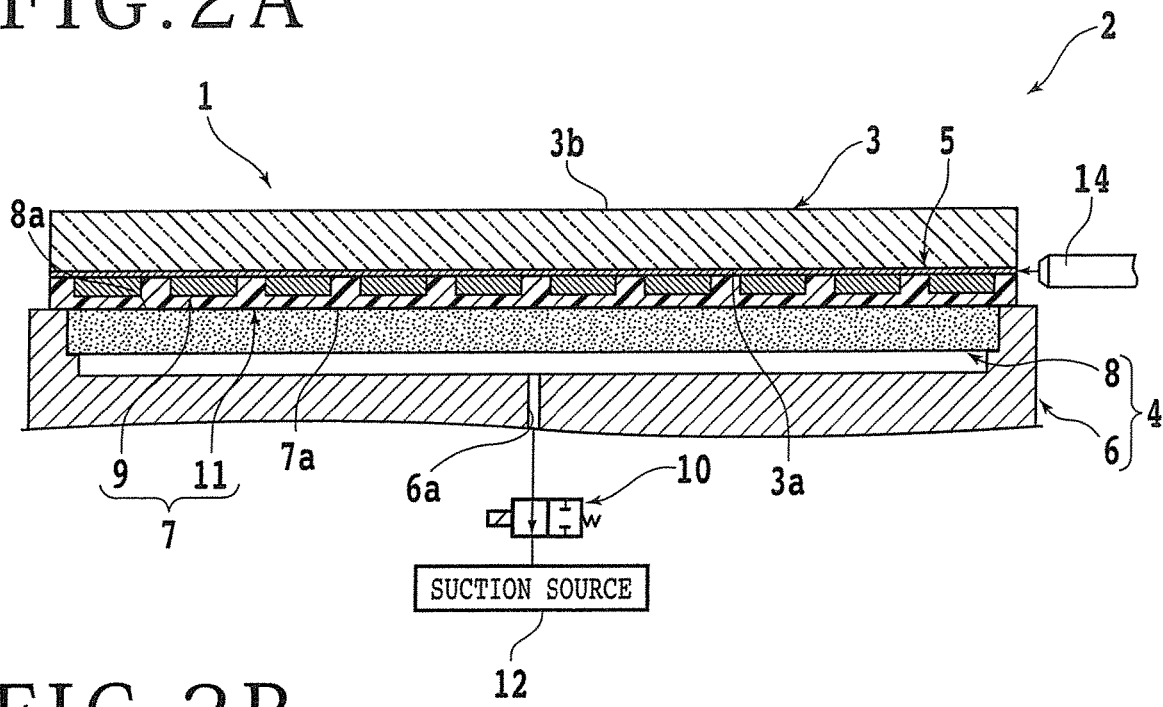
FIG. 2A is a partly sectional side view illustrating a start point region forming step.

After the first holding step, a start point region forming step is conducted in which a fluid is blown to an end portion of the peel layer 5 to form a start point region which will serve as a start point when peeling off the substrate 7 from the support plate 3. FIG. 2A is a partly sectional side view illustrating the start point region forming step. Note that in FIG. 2A, also, part of the components is depicted in terms of functional blocks.

The start point region forming step is carried out using the peeling apparatus 2 successively. As illustrated in FIG. 2A, a nozzle 14 for jetting the fluid is disposed on the upper side of the chuck table 4. The nozzle 14 is supported, for example, by a moving mechanism (not illustrated), and is moved in a direction substantially perpendicular to the holding surface 8a and a direction substantially parallel to the holding surface 8a.

In the start point region forming step, for example, the chuck table 4 holding the composite substrate 1 thereon is rotated, whereby a jet port of the nozzle 14 is oriented to an end portion of the peel layer (or an end portion of the support plate 3 and the substrate 7). In addition, the chuck table 4 and the nozzle 14 are relatively moved, to adjust the distance between the composite substrate 1 and the nozzle 14.

Thereafter, while jetting the fluid from the jet port of the nozzle 14 toward the end portion of the peel layer 5, the chuck table 4 and the nozzle 14 are relatively moved in such a manner that the nozzle 14 is moved along the end portion of the peel layer 5. By this, the start point region which will serve as a start point at the time of peeling can be formed at the end portion of the peel layer 5.

The start point region is desirably formed along the whole circumference of the composite substrate (or the whole part of the end portion of the peel layer 5). This permits the substrate 7 to be suitably peeled off from the support plate 3. It is to be noted, however, that the start point region may be formed at only a part of the end portion of the peel layer 5, within such a range that the substrate 7 can be suitably peeled off from the support plate 3.

As the fluid jetted from the nozzle 14, there may be used, for example, a gas such as air, a liquid such as water, or a mixed fluid obtained by mixing a gas with a liquid. Particularly, in the case where a binary fluid obtained by mixing air with water is used as the fluid, it is easy to form a suitable start point region. The distance between the chuck table 4 and the nozzle 14 is adjusted within such a range that the start point region can be suitably formed, according to conditions such as the material of the peel layer 5, the kind of the fluid jetted from the nozzle 14, the pressure at which the fluid is jetted, etc.

Figure 2B:
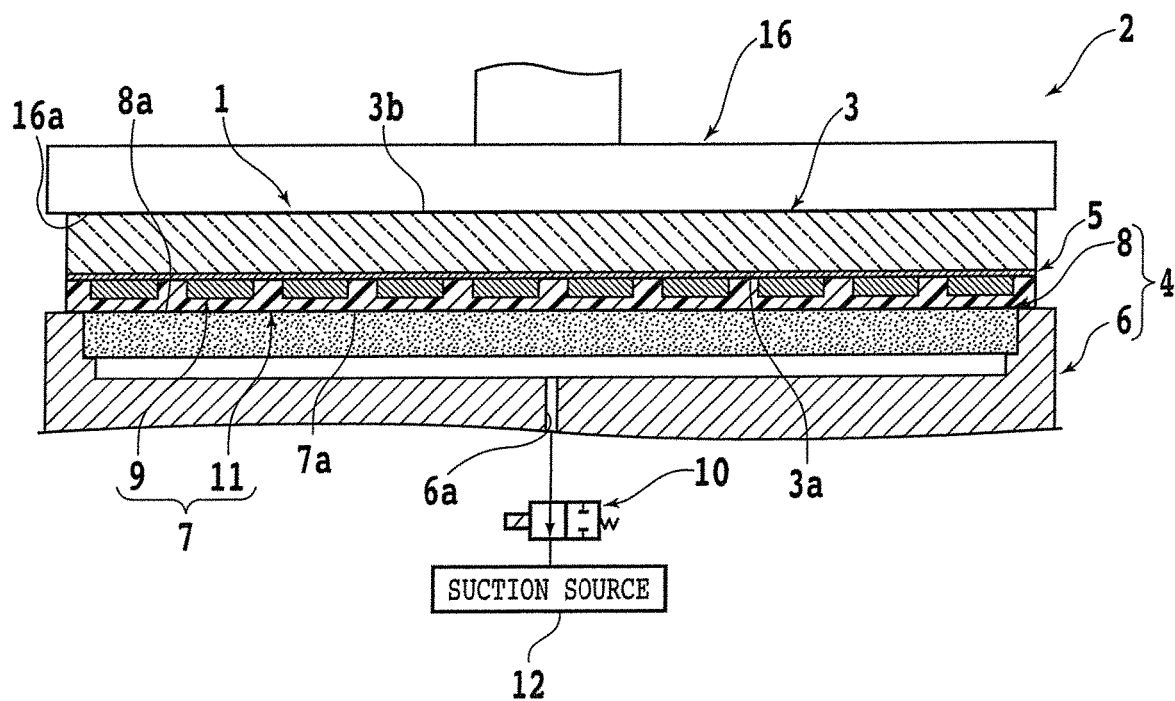
FIG. 2B is a partly sectional side view illustrating a second holding step.

After the start point region forming step, a second holding step is performed in which the support plate 3 side of the composite substrate 1, of which the substrate 7 side is held by the chuck table 4, is further held. FIG. 2B is a partly sectional side view illustrating the second holding step. Note that in FIG. 2B, also, part of the components is depicted in terms of functional blocks.

The second holding step is carried out using the peeling apparatus 2 successively. As depicted in FIG. 2B, a suction pad (second holding unit) 16 for holding the composite substrate 1 is disposed on the upper side of the chuck table 4. A lower surface of the suction pad is a holding surface 16a for suction holding the support plate 3 side of the composite substrate 1.

The holding surface 16a is connected to a suction source (not illustrated) through a passage (not illustrated), a valve (not illustrated), and the like. Therefore, with the valve opened, a negative pressure of the suction source can be made to act at the holding surface 16a. The suction pad 16 is supported by a moving mechanism (not illustrated), for example, and is moved in a direction substantially perpendicular to the holding surface 8a and in a direction substantially parallel to the holding surface 8a.

In the second holding step, for example, the chuck table 4 holding the composite substrate 1 thereon and the suction pad 16 are relatively moved, to bring the holding surface 16a of the suction pad 16 into contact with the second surface 3b of the support plate 3. Then, the valve is opened, to cause the negative pressure of the suction source to act at the holding surface 16a. By this, in a state in which the substrate 7 side of the composite substrate 1 is suction held by the chuck table 4, the support plate 3 side is suction held by the suction pad 16.

Figure 3:
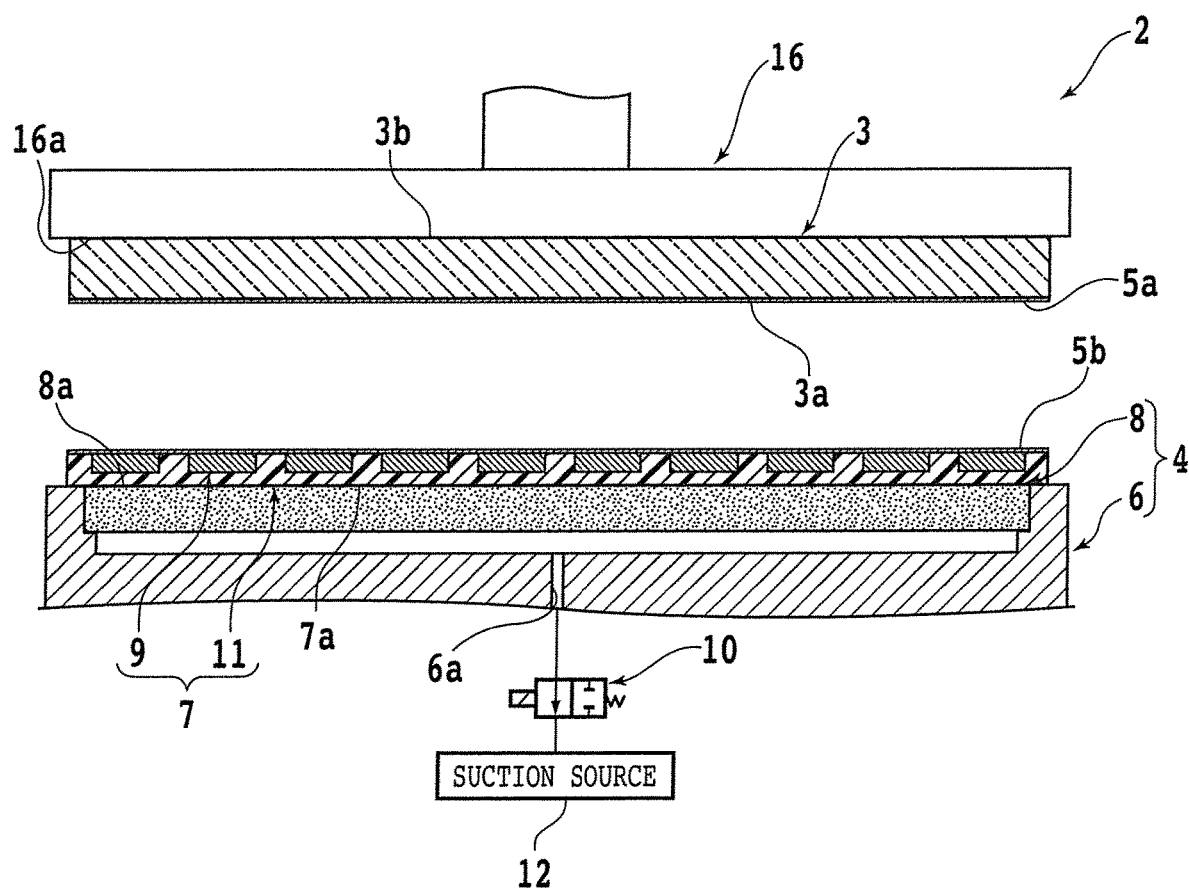
FIG. 3 is a partly sectional side view illustrating a peeling step.

After the second holding step, a peeling step is performed in which the chuck table 4 and the suction pad 16 are relatively moved in directions for spacing away from each other to peel off the substrate 7 from the support plate 3 is performed. FIG. 3 is a partly sectional side view illustrating the peeling step. Note that in FIG. 3, also, part of the components is depicted in terms of functional blocks.

In the peeling step, as illustrated in FIG. 3, for example, a force is exerted on the suction pad 16 by the moving mechanism in such a manner that the suction pad 16 is moved substantially perpendicularly to the holding surface 8a and in a direction for spacing away from the chuck table 4. As aforementioned, the substrate of the composite substrate 1 is suction held by the chuck table 4, and the support plate 3 of the composite substrate 1 is suction held by the suction pad 16. In addition, the start point region which will serve as a start point at the time of peeling is formed at the end portion of the peel layer 5.

Therefore, when a force substantially perpendicularly to the holding surface 8a and in the direction for spacing away from the chuck table 4 is exerted on the suction pad 16, the peel layer 5 is separated into a first portion 5a in close contact with the support plate 3 side and a second portion 5b in close contact with the substrate 7 side. Then, the suction pad 16 is moved substantially perpendicularly to the holding surface 8a and in the direction for spacing away from the chuck table 4, whereby the substrate 7 is peeled off from the support plate 3.

As has been described above, in the peeling method according to the present embodiment, the fluid is blown to the end portion of the peel layer 5 to form the start point region which will serve as a start point when peeling the substrate (sealed substrate) 7 from the support plate 3, and, therefore, the substrate 7 can be easily peeled off from the support plate 3, with the start point region as the start point. In other words, the possibility of damaging of the substrate 7 or the support plate 3 at the time of peeling can be suppressed to a low level.

Note that the present invention is not limited to the above-described embodiment, and can be carried out with various modifications. For instance, while the substrate 7 side of the composite substrate 1 is held by the chuck table 4 in the first holding step and the support plate 3 side of the composite substrate 1 is held by the suction pad 16 in the second holding step in the above embodiment, the support plate 3 side of the composite substrate 1 may be held by the chuck table 4 in the first holding step and the substrate 7 side of the composite substrate 1 may be held by the suction pad 16 in the second holding step.

In addition, while the composite substrate 1 is held by sucking the substrate 7 side by the chuck table 4 in the first holding step in the above embodiment, the composite substrate 1 may be held, for example, by a method in which the first surface 7a of the substrate 7 is brought into contact with the chuck table 4 and an edge or the like of the substrate 7 is pressed from above or a lateral side by an arbitrary member.

Note that in this case, it is sufficient to press the edge or the like of the substrate 7 from above or a lateral side at least before the peeling step. Besides, when holding the support plate 3 side of the composite substrate 1 by a similar method, the second surface 3b of the support plate 3 is brought into contact with the chuck table 4, and an edge or the like of the support plate 3 is pressed from above or a lateral side by an arbitrary member.

In addition, for example, there is a possibility that the first surface 3a side of an end portion of the support plate 3 used in the above embodiment is covered with part of the metallic film or resin film constituting the peel layer 5. In that case, it is difficult to form the start point region at the end portion of the peel layer 5, and it is highly possible that the substrate 7 cannot be easily peeled off from the support plate 3.

Figure 4A:
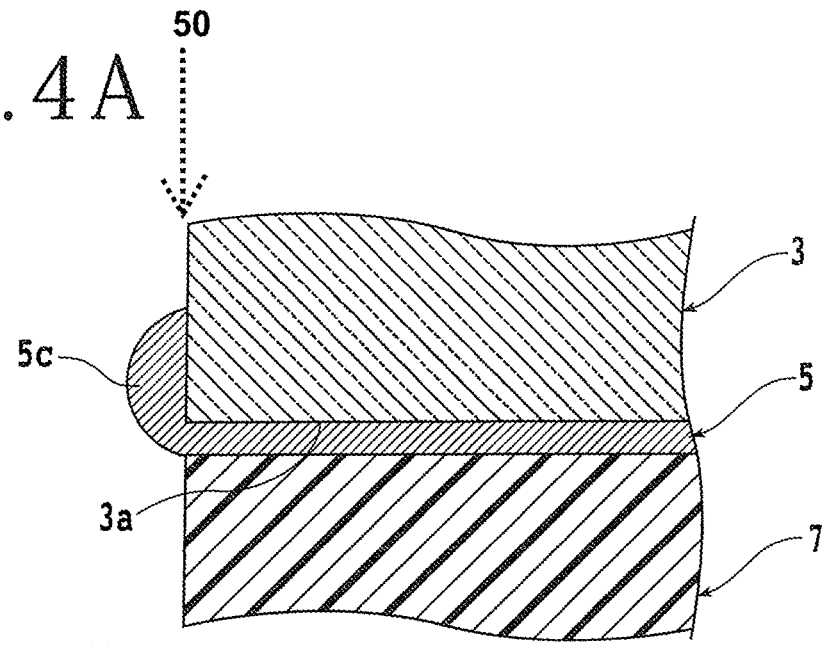
FIG. 4A is a sectional view illustrating, in an enlarged form, a state of an end portion of the support plate before a removing step is performed.

In such a case, therefore, it is recommendable to perform a removing step of removing the metallic film or resin film covering the first surface 3a side of the end portion of the support plate 3, prior to the start point region forming step. FIG. 4A is a sectional view illustrating, in an enlarged form, a state of the end portion of the support plate before the removing step is performed, and FIG. 4B is a partly sectional side view depicting the removing step.

As illustrated in FIG. 4A, the first surface 3a side of the end portion of the support plate 3 used in the peeling method according to a modification is covered by part 5c of the metallic film or resin film constituting the peel layer 5. In this modification, therefore, the part 5c of the metallic film or resin film is removed, to make it easy to form the start point region at the end portion of the peel layer 5 in the subsequent start point region forming step.

Figure 4B:
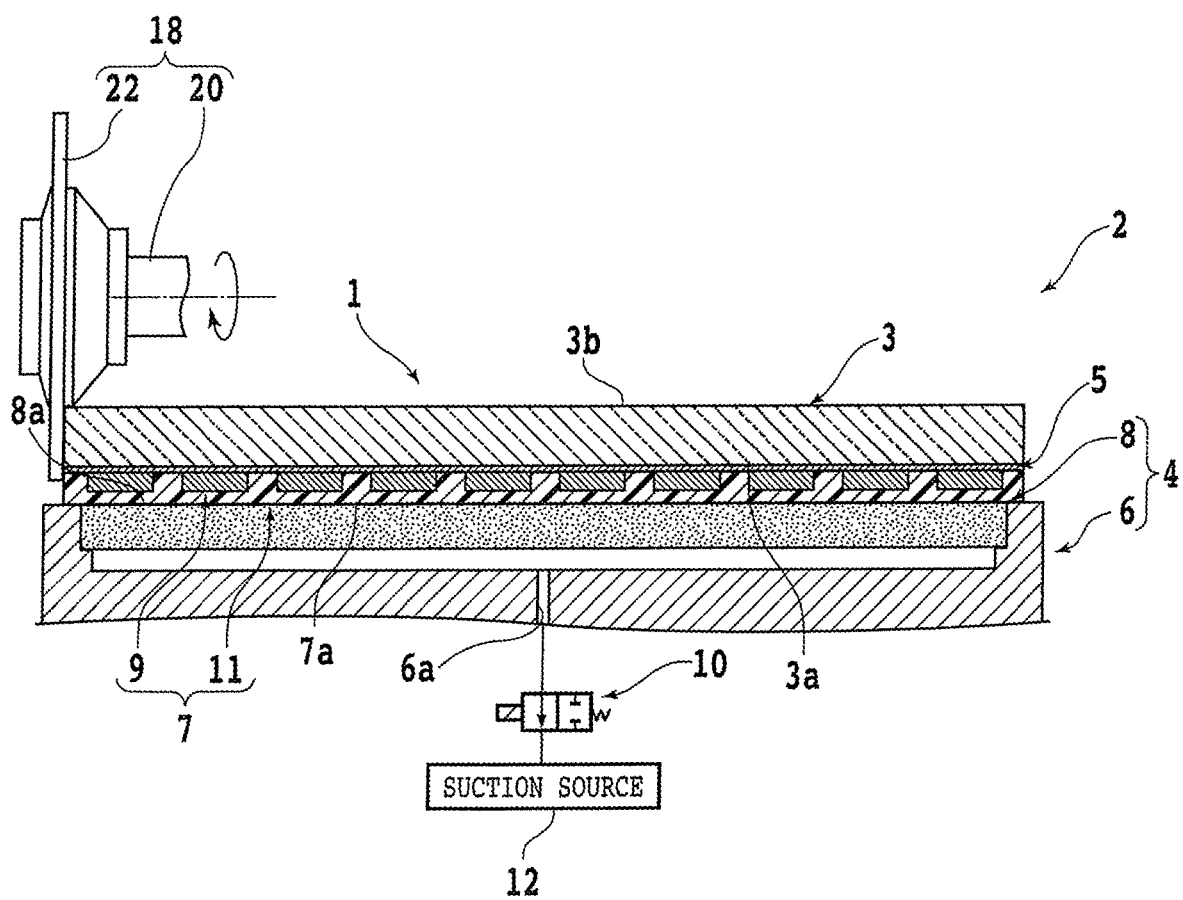
FIG. 4B is a partly sectional side view illustrating the removing step.

Specifically, as depicted in FIG. 4B, the part 5c of the metallic film or resin film is removed by use of a cutting unit 18 provided in the peeling apparatus 2. The cutting unit 18 includes, for example, a spindle 20 with a rotational axis substantially parallel to the holding surface 8a of the chuck table 4. An annular cutting blade 22 having abrasive grains dispersed in a binder is mounted to one end side of the spindle 20.

A rotational drive source (not illustrated) such as a motor is connected to the other end side of the spindle 20, and the cutting blade 22 mounted to the one end side of the spindle 20 is rotated by a force transmitted from the rotational drive source. The cutting unit 18 is supported, for example, by a moving mechanism (not illustrated), and is moved in a direction substantially perpendicular to the holding surface 8a and in a direction substantially parallel to the holding surface 8a.

In the removing step, first, the chuck table 4 holding the composite substrate 1 thereon is rotated, such that an outer peripheral edge inclusive of the end portion of the support plate 3 is set perpendicular to the rotational axis (spindle 20) of the cutting blade 22 in plan view. Then, the chuck table 4 and the cutting unit 18 are relatively moved, to position the cutting blade 22 on the upper side of an extension line of the outer peripheral edge inclusive of the end portion of the support plate 3 mentioned above. In addition, a lower end of the cutting blade 22 is positioned at a position below the first surface 3a of the support plate 3.

Thereafter, while rotating the cutting blade 22, the chuck table 4 is moved in a direction parallel to the outer peripheral edge inclusive of the end portion of the support plate 3. By this, the cutting blade 22 can be made to cut into the part 5c of the metallic film or resin film covering the first surface 3a side of the end portion of the support plate 3, and the part 5c of the metallic film or resin film can be removed.

As a result, a suitable laminate structure or the like of the peel layer 5 is exposed at the end portion of the peel layer 5, and it becomes easy to form the start point region at the end portion of the peel layer 5 in the start point region forming step conducted later. When the part 5c of the metallic film or resin film covering the first surface 3a side of the end portion of the support plate 3 is completely removed by repeating the above-mentioned operation, the removing step is completed.

Note that while the part 5c of the metallic film or resin film covering the first surface 3a side of the end portion of the support plate 3 is removed here by the method of causing the cutting blade 22 to cut into the part 5c, the part 5c of the metallic film or resin film can also be removed by a method of applying a laser beam 50 (see FIG. 4A) of such a wavelength as to be absorbed in the part 5c.

In addition, while the substrate 7 is peeled off from the support plate 3 before the substrate 7 is divided into the small pieces such as package devices corresponding to the device chips 9 in the above embodiment, the substrate 7 may be divided into the small pieces such as package devices and then the small pieces may be peeled off from the support plate 3.

Figure 5A:
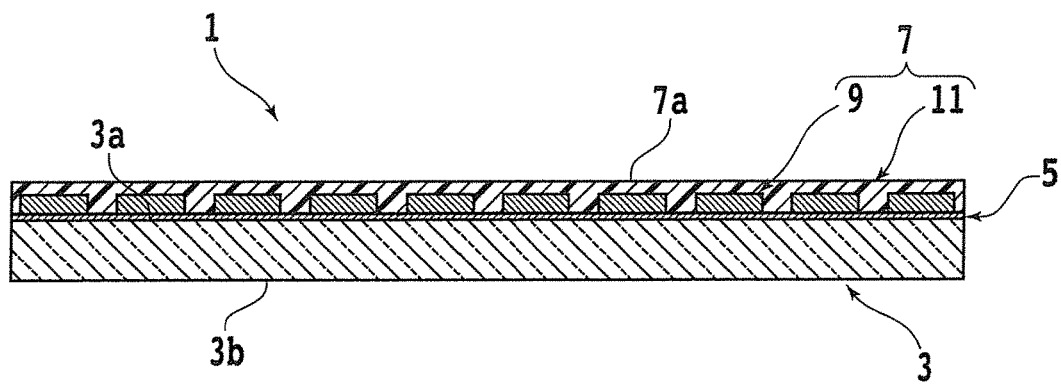
FIG. 5A is a sectional view illustrating a configuration example of a composite substrate used in a peeling method according to a modification.

FIG. 5A is a sectional view illustrating a configuration example of a composite substrate 1 used in a peeling method according to a modification. As depicted in FIG. 5A, the basic configuration of the composite substrate 1 used in this modification is substantially the same as that of the composite substrate 1 according to the above embodiment. It is to be noted, however, that in the modification, an unrequired region (for example, an end portion) of the composite substrate 1 is preliminarily removed by such a method as dicing conducted using a cutting blade.

Figure 5B:
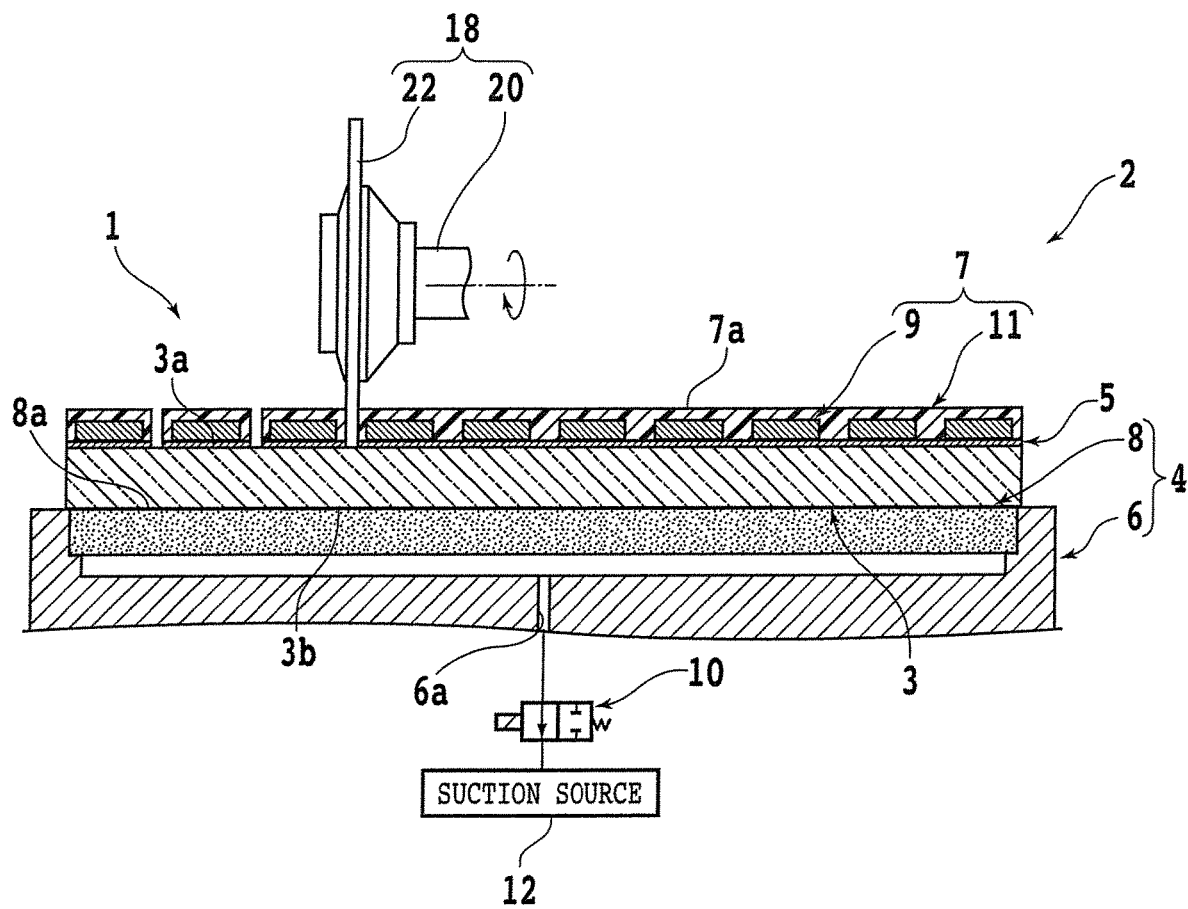
FIG. 5B is a partly sectional side view illustrating a first holding step and a dividing step of the peeling method according to the modification.

After the unrequired region of the composite substrate 1 is removed, a first holding step of holding the support plate 3 side of the composite substrate 1 and exposing the substrate 7 side is performed. FIG. 5B is a partly sectional side view illustrating the first holding step and a dividing step of the peeling method according to the modification. Note that in FIG. 5B, part of the components is depicted in terms of functional blocks.

The first holding step is conducted using a peeling apparatus 2, like the first holding step according to the above embodiment. Specifically, as illustrated in FIG. 5B, for example, a second surface 3b of the support plate 3 is brought into contact with a holding surface 8a of a chuck table 4. Then, a valve 10 is opened, to cause a negative pressure of a suction source 12 to act at the holding surface 8a. By this, the support plate 3 side of the composite substrate 1 is suction held by the chuck table 4. Thus, the first surface 7a side of the substrate 7 comes into an exposed state.

After the first holding step, the dividing step of dividing the substrate 7 along division lines into a plurality of small pieces is performed. As illustrated in FIG. 5B, the dividing step is conducted, for example, by use of a cutting unit 18 of the peeling apparatus 2. The basic configuration of the cutting unit 18 may be substantially the same as that of the cutting unit 18 used in the aforementioned removing step, but, in this dividing step, a cutting blade 22 suited to cutting of the substrate 7 is used.

In the dividing step, first, the chuck table 4 holding the composite substrate 1 thereon is rotated, such that the division line set on the substrate 7 is set perpendicular to the rotational axis (spindle 20) of the cutting blade 22 in plan view. Then, the chuck table 4 and the cutting unit 18 are relatively moved, to position the blade 22 on the upper side of an extension line of the division line to be cut.

In addition, a lower end of the cutting blade 22 is positioned at such a height that the substrate 7 can be cut completely. Specifically, the lower end of the cutting blade 22 is positioned at such a height as to be able to at least cut into the peel layer 5. Thereafter, while rotating the cutting blade 22, the chuck table 4 is moved in a direction parallel to the division line to be cut.

By this, the cutting blade 22 can be made to at least cut into the peel layer 5 from the substrate 7 side along the division line to be cut, and the substrate 7 can be cut. Such an operation is repeated as required, to divide the substrate 7 into small pieces having an arbitrary size, whereon the dividing step is finished. Note that in this modification, the substrate 7 is cut along all the division lines, whereby a plurality of package devices (small pieces) 13 (see FIG. 6A) corresponding to the device chips 9 are formed.

Figure 6A:
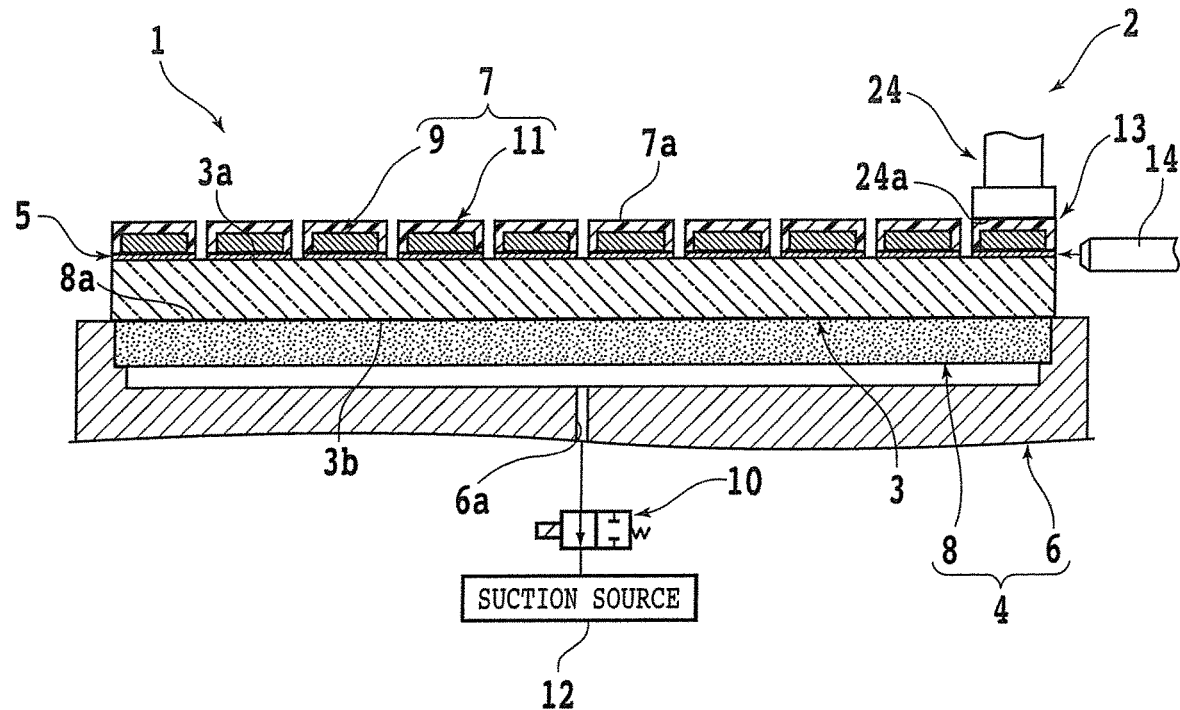
FIG. 6A is a partly sectional side view illustrating a start point region forming step and a second holding step of the peeling method according to the modification.

After the dividing step, a start point region forming step is conducted in which a fluid is blown to an end portion of the peel layer 5 to form a start point region which will serve as a start point when peeling off the package devices 13 from the support plate 3. FIG. 6A is a partly sectional side view illustrating the start point region forming step and a second holding step of the peeling method according to the modification. Note that in FIG. 6A, also, part of the components is depicted in terms of functional blocks.

The start point region forming step is carried out using the peeling apparatus 2 successively, like the start point region forming step according to the above embodiment. Specifically, for example, the chuck table 4 holding the composite substrate 1 thereon is rotated, such that a jet port of a nozzle 14 is directed to an end portion of the peel layer 5 (or an end portion of the package device 13). In addition, the chuck table 4 and the nozzle 14 are relatively moved, to adjust the distance between the package device 13 and the nozzle 14.

Thereafter, while jetting the fluid from the jet port of the nozzle 14 toward the end portion of the peel layer 5, the chuck table 4 and the nozzle 14 are relatively moved in such a manner that the nozzle 14 is moved along the end portion of the peel layer 5. By this, the start point region which will serve as a start point at the time of peeling can be formed along the end portion of the peel layer 5. Note that the conditions for the start point region forming step according to the modification may be similar to those for the start point region forming step according to the above embodiment.

After the start point region forming step, the second holding step of further holding the package device 13 in a state in which the support plate 3 side is held by the chuck table 4 is performed. The second holding step is carried out using the peeling apparatus 2 successively. As depicted in FIG. 6A, a collet (pick-up tool; second holding unit) 24 for holding the package device 13 is disposed. A lower surface of the collet 24 is a holding surface 24a for suction holding the package device 13.

The holding surface 24a is connected to a suction source (not illustrated) through a passage (not illustrated), a valve (not illustrated), and the like. With the valve opened, therefore, a negative pressure of the suction source can be made to act at the holding surface 24a. The collet 24 is supported, for example, by a moving mechanism (not illustrated), and is moved in a direction substantially perpendicular to the holding surface 8a and in a direction substantially parallel to the holding surface 8a.

In the second holding step, for example, the chuck table 4 holding the composite substrate 1 thereon and the collet 24 are relatively moved, such that the holding surface 24a of the collet 24 is put into contact with an upper surface of the package device 13 or the like. Then, the valve is opened, to cause the negative pressure of the suction source to act at the holding surface 24a. By this, the package device 13 side is suction held by the collet 24 in a state in which the substrate 7 side of the composite substrate 1 is suction held by the chuck table 4.

Figure 6B:
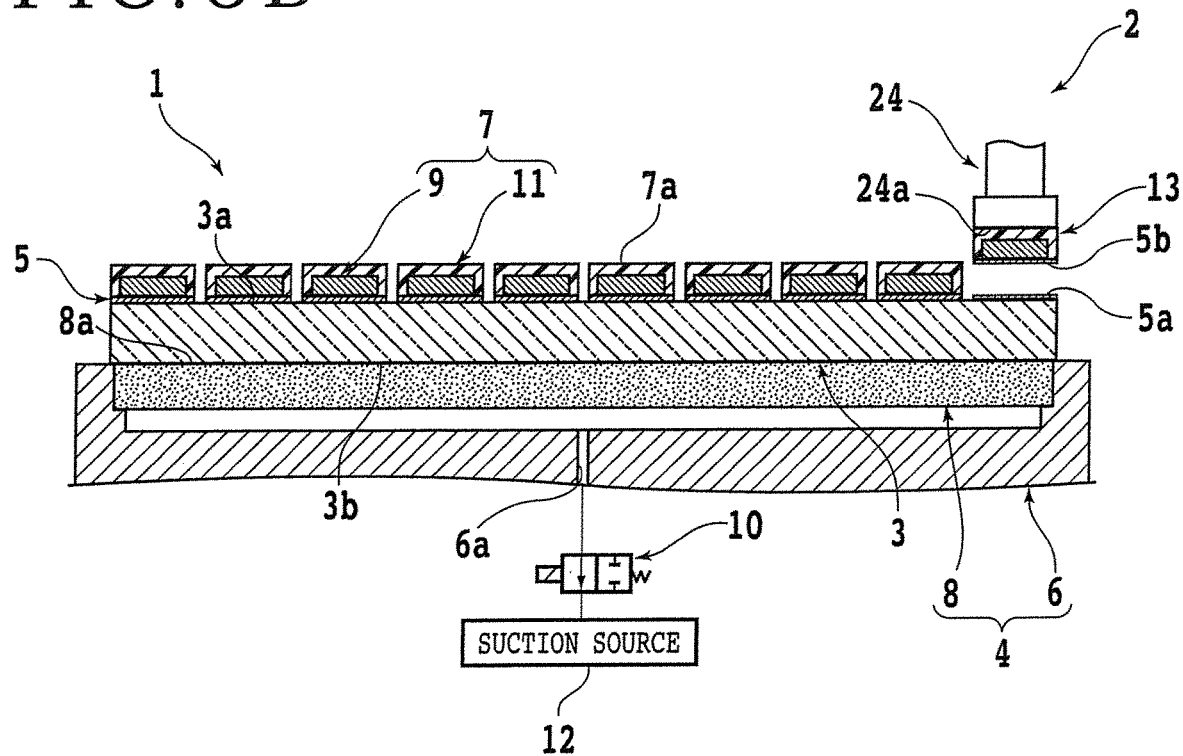
FIG. 6B is a partly sectional side view illustrating a peeling step in the peeling method according to the modification.

After the second holding step, a peeling step is performed in which the chuck table 4 and the collet 24 are relatively moved in directions for spacing away from each other, to peel off the package device 13 from the support plate 3. FIG. 6B is a partly sectional side view illustrating the peeling step of the peeling method according to the modification. Note that in FIG. 6B, also, part of the components is depicted in terms of functional blocks.

As illustrated in FIG. 6B, in the peeling step, for example, a force is exerted on the collet 24 by the moving mechanism in such a manner that the collet 24 is moved substantially perpendicularly to the holding surface 8a and in a direction for spacing away from the chuck table 4. As aforementioned, the substrate 7 of the composite substrate 1 is suction held by the chuck table 4, and the package device 13 is suction held by the collet 24. In addition, the start point region which will serve as a start point at the time of peeling is formed at an end portion of the peel layer 5 that corresponds to the end portion of the package device 13.

When a force substantially perpendicular to the holding surface 8a and in a direction for spacing away from the chuck table 4 is exerted on the collet 24, therefore, the peel layer 5 is separated into a first portion 5a in close contact with the support plate 3 side and a second portion 5b in close contact with the package device 13 side, with the aforementioned start region as a start point. Then, the collet 24 is moved substantially perpendicularly to the holding surface 8a and in the direction for spacing away from the chuck table 4, whereby the package device 13 is peeled off from the support plate 3.

Note that in the peeling method according to the modification, for example, it is desirable that the start point region forming step, the second holding step, and the peeling step are conducted repeatedly until all the package devices 13 are peeled off from the support plate 3. In this case, in the start point region forming step, it is sufficient to form the start point region only at the end portion of the peel layer 5 that corresponds to the end portion of the package device 13 to be peeled off in the subsequent peeling step.

In addition, while the package device 13 corresponding to each device chip 9 is peeled off from the support plate 3 in this modification, a small piece divided to an arbitrary size inclusive of a plurality of device chips 9 can also be peeled off from the support plate 3 by a similar method. Besides, while the substrate 7 is divided into the small pieces by the method in which the cutting blade 22 is caused to cut into the substrate 7 in the dividing step according to the modification, the substrate 7 may be cut and divided into the small pieces by a method in which a laser beam of such a wavelength as to be absorbed in the substrate 7 is applied to the substrate 7.

Besides, while the case where the composite substrate 1 configured to be rectangular in shape in plan view is used is illustrated in the above embodiment and modification, in the cases where a disk-shaped composite substrate is used, the operations of the component parts and the like are modified according to the shape of the composite substrate and the like factors. For example, in the start point region forming step and the removing step, it is sufficient that a fluid is blown to an end portion of the peel layer 5, or the cutting blade 22 is made to cut into a part 5c of the metallic film, while rotating the chuck table 4.

Other than the aforementioned, the structures, methods, and the like according to the above embodiment can be appropriately modified, in carrying out the present invention, within the scope of the object of the invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A peeling method for peeling off a substrate provided over a front surface of a support plate through a peel layer from the support plate after dividing the substrate into a plurality of pieces, the peeling method comprising:
   a first holding step of holding the support plate by a first holding unit;
   a dividing step of causing a cutting blade to cut into the substrate, or applying a laser beam of such a wavelength as to be absorbed in the substrate to the substrate, along division lines set on the substrate, to divide the substrate into the plurality of pieces;
   a start point region forming step of blowing a fluid to the peel layer exposed at an end portion of a piece among the plurality of pieces, to form a start point region which will serve as a start point when peeling off the piece from the support plate;
   a second holding step of holding the piece by a second holding unit; and
   a peeling step of relatively moving the first holding unit and the second holding unit in directions for spacing away from each other, to peel off the piece from the support plate.

2. The peeling method of claim 1 wherein the peel layer comprises a metallic film.

3. The peeling method of claim 1 wherein a side of the front surface of an end portion of the support plate is covered with part of a metallic film or resin film constituting the peel layer, and
   the peeling method further includes a removing step of removing the metallic film or resin film covering the side of the front surface of the end portion of the support plate by a cutting blade or a laser beam, before the start point region forming step.

4. The peeling method of claim 3 wherein the first and second holding steps comprise holding by using suction.

5. The peeling method of claim 3 wherein the fluid is a gas.

6. The peeling method of claim 5 wherein the gas is air.

7. The peeling method of claim 3 wherein the fluid is a liquid.

8. The peeling method of claim 7 wherein the liquid is water.

9. The peeling method of claim 3,
   wherein the support plate and the substrate each have a circumference, and
   wherein the start point region forming step comprises blowing the fluid to the end portion of the peel layer exposed at the end portion of the support plate and the substrate along the entire circumferences of the support plate and the substrate.

10. The peeling method of claim 3 wherein the substrate has a thickness of not more than 1.5 mm.

11. The peeling method of claim 3 wherein the peel layer has a thickness of not more than 20 μm.

12. The peeling method of claim 3 wherein the support plate has a thickness of not more than 2 mm.

13. The peeling method of claim 1 wherein the piece comprises a package device.

14. The peeling method of claim 1 wherein each of the plurality of pieces comprises a package device.

15. The peeling method of claim 14 wherein the start point region forming step, the second holding step, and the peeling step are conducted repeatedly until each of the package devices are peeled off from the support plate.

16. The peeling method of claim 1 wherein the start point region forming step, the second holding step, and the peeling step are conducted repeatedly until all the plurality of pieces are peeled off from the support plate.

17. The peeling method of claim 1 wherein the piece comprises a plurality of device chips.

* * * * *